(12) United States Patent
Gabriel et al.

(10) Patent No.: US 6,475,929 B1
(45) Date of Patent: Nov. 5, 2002

(54) METHOD OF MANUFACTURING A SEMICONDUCTOR STRUCTURE WITH TREATMENT TO SACRIFICIAL STOP LAYER PRODUCING DIFFUSION TO AN ADJACENT LOW-K DIELECTRIC LAYER LOWERING THE CONSTANT

(75) Inventors: Calvin T. Gabriel; Suzette K. Pangrle, both of Cupertino; Lynne A. Okada, Sunnyvale; Fei Wang, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 28 days.

(21) Appl. No.: 09/774,708

(22) Filed: Feb. 1, 2001

(51) Int. Cl.$^7$ ............................................. H01L 23/58
(52) U.S. Cl. .................. 438/783; 438/781; 438/586
(58) Field of Search ............................ 438/778, 781, 438/783, 784, 923, 586

(56) References Cited

U.S. PATENT DOCUMENTS 6,149,779 A * 11/2000 Van Cleemput ....... 204/192.37

* cited by examiner

*Primary Examiner*—Richard Elms
*Assistant Examiner*—Beth E. Owens (57) ABSTRACT

A method of manufacturing a low-k semiconductor structure including the steps of forming a low-k dielectric layer, forming a sacrificial etch stop layer adjacent the low-k dielectric layer, and applying energy to the sacrificial etch stop layer to diffuse a component of the sacrificial etch stop layer into the adjacent low-k dielectric layer. This diffusion of the component lowers the dielectric constant of the adjacent low-k dielectric layer.

18 Claims, 11 Drawing Sheets

METHOD OF MANUFACTURING A SEMICONDUCTOR STRUCTURE WITH TREATMENT TO SACRIFICIAL STOP LAYER PRODUCING DIFFUSION TO AN ADJACENT LOW-K DIELECTRIC LAYER LOWERING THE CONSTANT

FIELD OF THE INVENTION

The present invention relates to the manufacturing of semiconductor devices, and more particularly, to utilization of copper and copper alloy metallization in low-k semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the sub-micron features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), electrically isolated transistors, and other structures, and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene"-type processing. Generally, this process involves forming a via opening in the inter-metal dielectric layer or interlayer dielectric (ILD) between vertically spaced metallization levels. The via opening is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

High performance microprocessor applications require high speed semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as inter-metal dielectric layers, create moisture/bias reliability problems when in contact with Al, and these problems have decreased the reliability of interconnections formed between various metallization levels.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization levels. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Another technique to increase the circuit speed is to reduce the capacitance of the inter-metal dielectric layers. Dielectric materials such as silicon oxide ($SiO_2$) have been commonly used to electrically separate and isolate or insulate conductive elements of the integrated circuit from one another. However, as the spacing between these conductive elements in the integrated circuit structure has become smaller, the capacitance between such conductive elements because of the dielectric being formed from silicon oxide is more of a concern. This capacitance negatively affects the overall performance of the integrated circuit because of increased power consumption, reduced speed of the circuitry, and cross-coupling between adjacent conductive elements.

A response to the problem of capacitance between adjacent conductive elements caused by use of silicon oxide dielectrics has led to the use of other dielectric materials, commonly known as low-k dielectrics. Whereas silicon oxide has a dielectric constant of approximately 4.0, many low-k dielectrics have dielectric constants less than 3.5. Examples of low-k dielectric materials include organic or polymeric materials. Another example is porous, low density materials in which a significant fraction of the bulk volume contains air, which has a dielectric constant of approximately 1. The properties of these porous materials are proportional to their porosity. For example, at a porosity of about 80%, the dielectric constant of a porous silica film, i.e. porous $SiO_2$, is approximately 1.5. Still another example of a low-k dielectric material is carbon doped silicon oxide wherein at least a portion of the oxygen atoms bonded to the silicon atoms are replaced by one or more organic groups such as, for example, an alkyl group such as a methyl ($CH_3$—) group.

A problem associated with the use of many low-k dielectric materials is that these materials can be damaged by exposure to oxidizing or "ashing" systems, which remove a resist mask used to form openings, such as vias, in the low-k dielectric material. This damage can cause the surface of the low-k dielectric material to become a water absorption site, if and when the damaged surface is exposed to moisture. Subsequent processing, such as annealing, can result in water vapor formation, which can interfere with subsequent filling with a conductive material of a via/opening or a damascene trench formed in the dielectric layer. For this reason, the upper surface of the low-k dielectric material is typically protected from damage during removal of the resist mask by a capping layer, such as silicon oxide, disposed over the upper surface.

A number of different variations of a damascene process using low-k dielectrics have been employed during semiconductor manufacturing. FIGS. 1A–1L depict a dual damascene process for forming vias and a second metallization level over a first metallization level, according to conventional techniques.

Figure 1A:
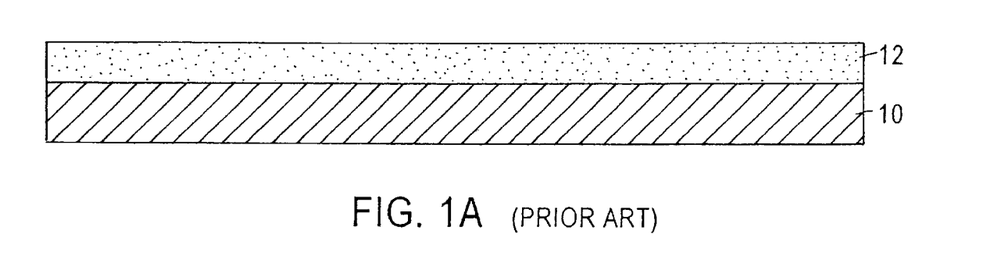
FIGS. 1A–1J schematically illustrate sequential phases of a conventional dual damascene process.

In FIG. 1A, a first etch stop layer 12 is deposited over a first metallization level 10. The first etch stop layer 12 acts as a passivation layer that protects the first metallization level 10 from oxidation and contamination and prevents diffusion of material from the first metallization level 10 into a subsequently formed dielectric layer. The first etch stop layer 12 also acts as an etch stop during subsequent etching of the dielectric layer. A typical material used as an etch stop is silicon nitride, and approximately 500 Angstroms of silicon nitride is typically deposited over the metallization level 10 to form the first etch stop layer 12. An illustrative process used for depositing silicon nitride is Plasma-Enhanced Chemical Vapor Deposition (PECVD).

Figure 1B:
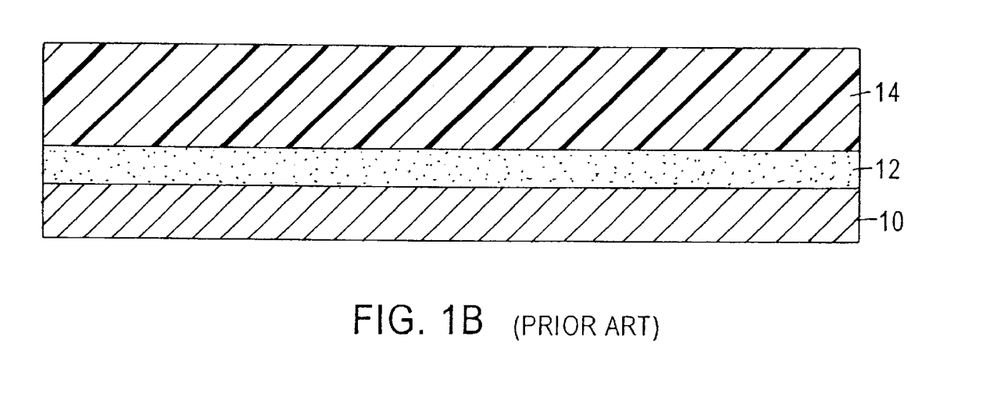

In FIG. 1B, a first low-k dielectric layer 14 is deposited over first etch stop layer 12. The majority of low-k dielectric materials used for a dielectric layer are based on organic or inorganic polymers. The liquid dielectric material is typically spun onto the surface under ambient conditions to a desired depth. This is typically followed by a heat treatment to evaporate solvents present within the liquid dielectric material and to cure the film to form the first low-k dielectric layer 14.

Figure 1C:
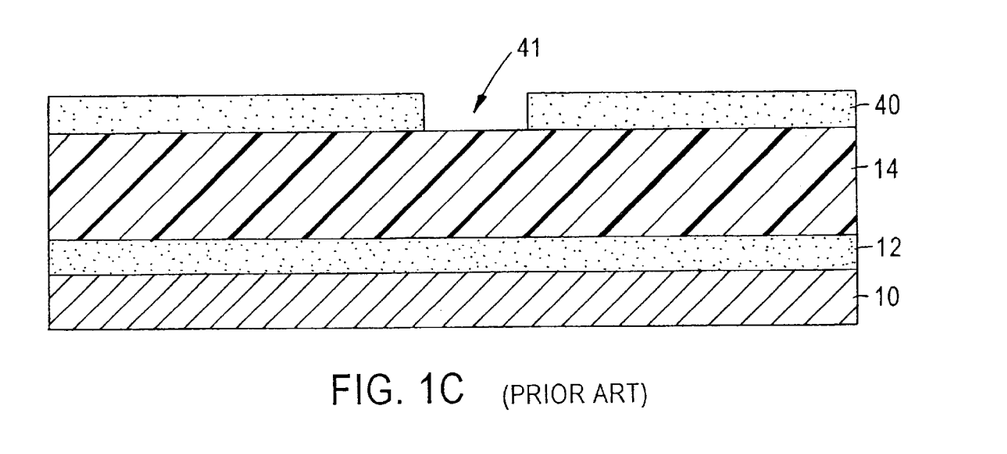

In FIG. 1C, a second etch stop layer 40 is deposited over the first low-k dielectric layer 14. The second etch stop layer 40 acts as an etch stop during etching of a dielectric layer subsequently formed over the second etch stop layer 40. As with the first etch stop layer 12, a material typically used as an etch stop is silicon nitride, and approximately 500 Angstroms of silicon nitride are typically deposited over the first low-k dielectric layer 14 to form the second etch stop layer 40. An illustrative process used for depositing silicon nitride is PECVD. A via pattern 41 is etched into the second etch stop layer 40 using conventional photolithography and appropriate anisotropic dry etching techniques, such as an $CF_4$ or $CHF_3$ etch, often with an inert gas, such as argon (Ar), and an oxidizer, such as $O_2$, added. These steps are not depicted in FIG. 1C and only the resulting via pattern 41 is depicted therein. The photoresist used in the via patterning is removed by an oxygen plasma, for example.

Figure 1D:
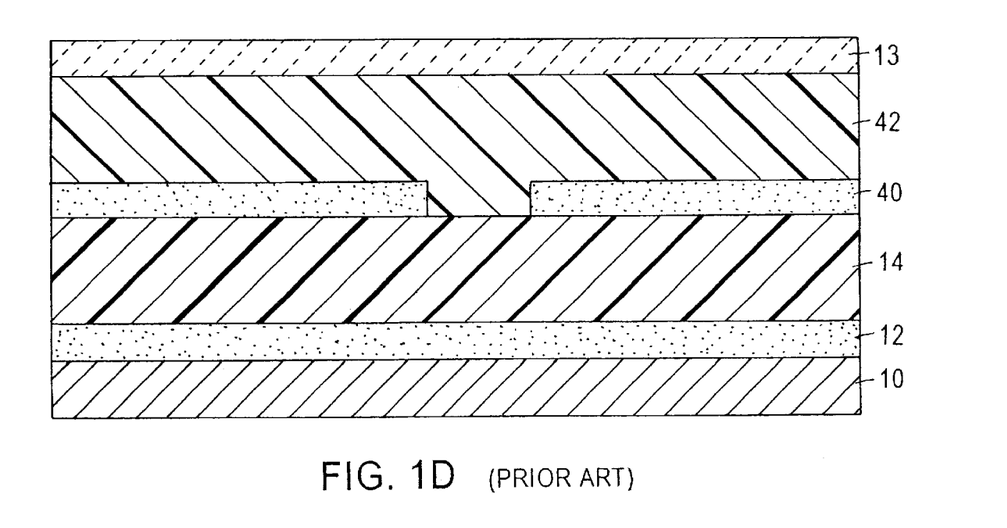

In FIG. 1D, a second low-k dielectric layer 42 is deposited over the second etch stop layer 40. After formation of the second low-k dielectric layer 42, a capping layer 13 can be formed over the second low-k dielectric layer 42. The function of the capping layer 13 is to protect the second low-k dielectric layer 42 from the process that removes a subsequently formed resist layer. The capping layer 13 can also be used as a mechanical polishing stop to prevent damage to the second low-k dielectric layer 42 during subsequent polishing away of conductive material that is deposited over the second low-k dielectric layer 42 and in a subsequently formed via and trench. Examples of materials used as a capping layer 13 include silicon oxide and silicon nitride.

Figure 1E:
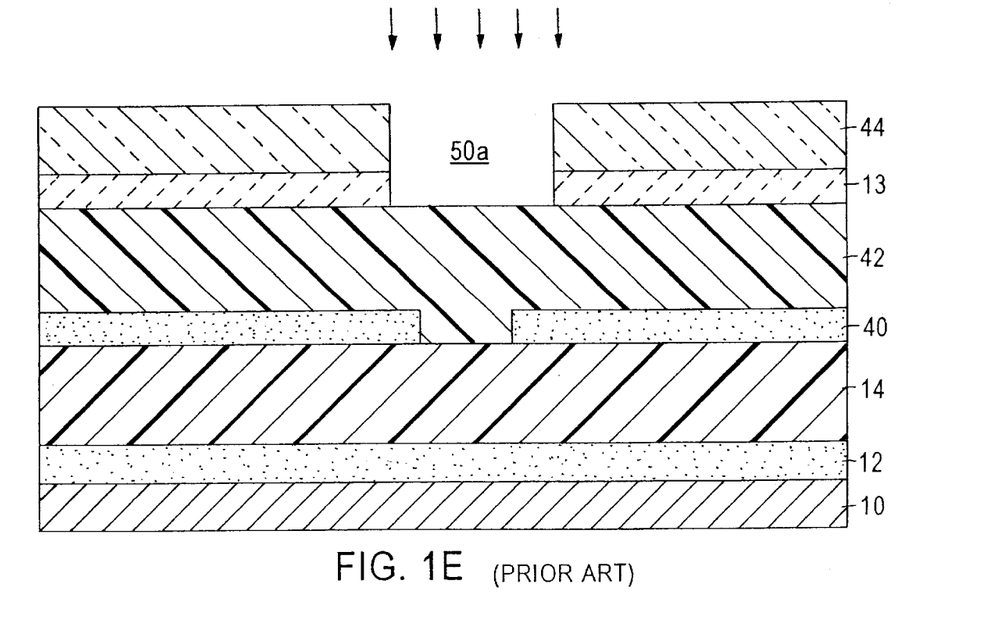

In FIG. 1E, the trenches are formed in the capping layer 13 using conventional lithographic and etch techniques. The lithographic process involves depositing a resist 44 over the capping layer 13 and exposing and developing the resist 44 to form the desired pattern of the trench. The first etch, which is an anistropic reactive ion plasma dry etch, removes the exposed portions of capping layer 13.

Figure 1F:
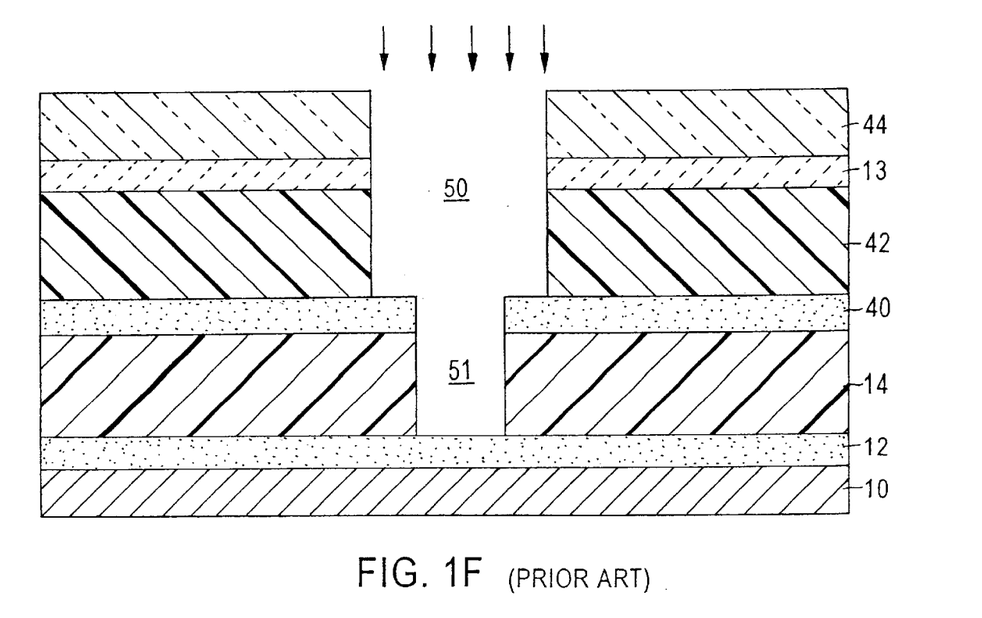

In FIG. 1F, a second etch, which preferentially etches the material of the first dielectric layer 14 and second dielectric layer 42, anisotropically removes the dielectric material until the first etch stop layer 12 is reached. In this way, a trench 50 and via 51 are formed in the same etching operation. The second etch is typically an anisotropic etch, such as a reactive ion plasma dry etch, that removes only the exposed portions of the first low-k dielectric layer 14 directly below the opening in the second etch stop layer 40 and the exposed portions of the low-k dielectric materials. By using an anisotropic etch, the via 51 and the trench 50 can be formed with substantially perpendicular sidewalls.

Figure 1G:
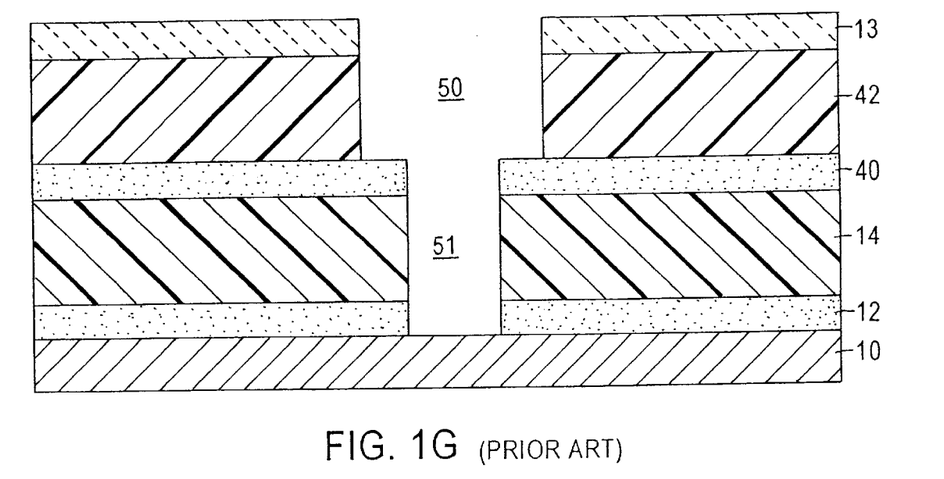

In many cases, the low-k etch chemistry etches the photoresist at approximately the same rate as the low-k dielectric. The thickness of the trench photoresist may then be selected to be completely consumed by the end of the etch operation, to eliminate the need for photoresist stripping. Another etch, which is highly selective to the material of the first etch stop layer 12, then removes the portion of the etch stop layer 12 underlying via 51 until the etchant reaches the first metallization level 10, as depicted in FIG. 1G. This etch is also typically a dry anisotropic etch chemistry designed not to attack any other layers in order to expose a portion of the metallization.

Figure 1H:
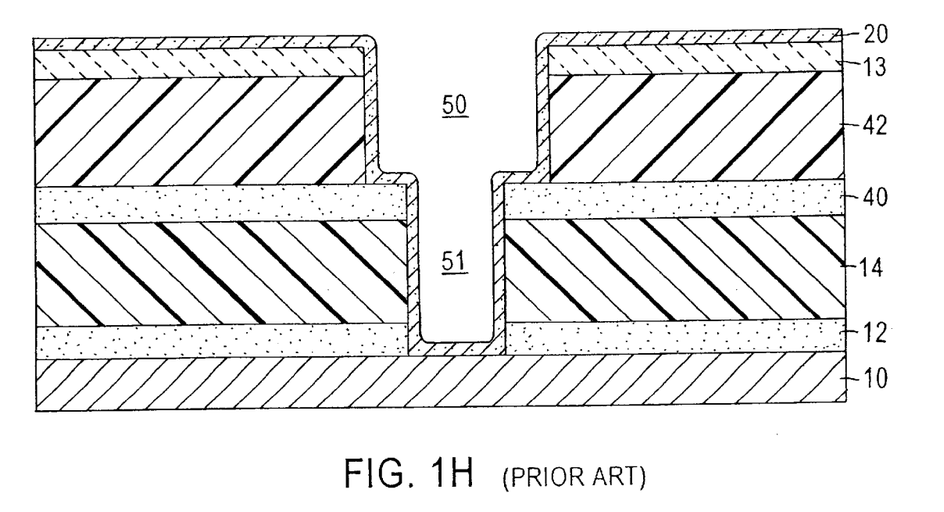

In FIG. 1H, an adhesion/barrier material, such as tantalum, titanium, tungsten, tantalum nitride, or titanium nitride, is deposited. The combination of the adhesion and barrier material is collectively referred to as a diffusion barrier layer 20. The diffusion barrier layer 20 acts to prevent diffusion into the first and second dielectric layers 14, 42 of the conductive material subsequently deposited into the via 51 and trench 50.

Figure 1I:
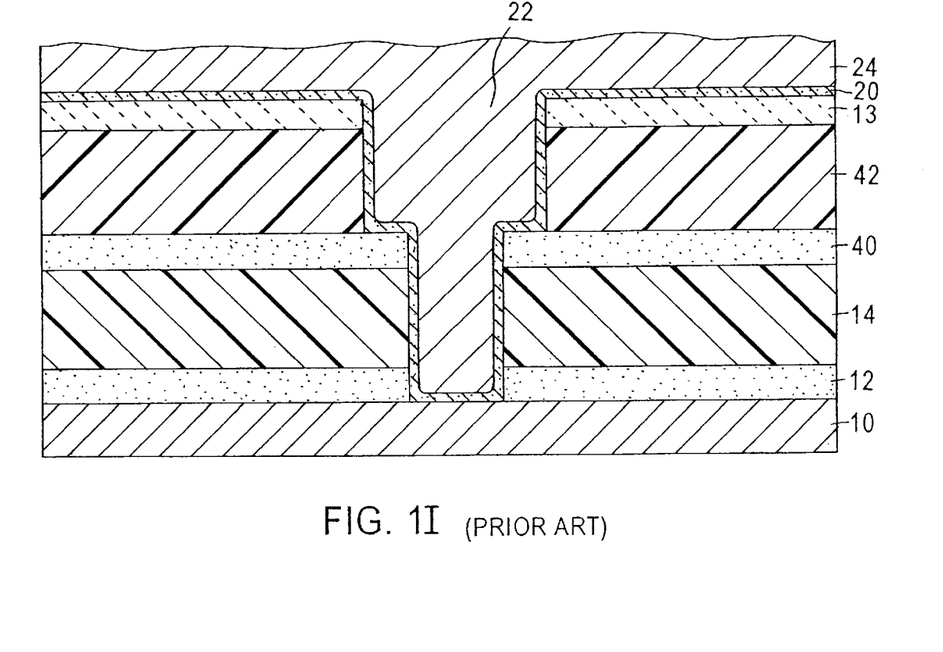

In FIG. 1I, a layer 22 of a conductive material, for example, a Cu or Cu-based alloy, is deposited in the via 51 and trench 50 and over the capping layer 13. A typical process initially involves depositing a "seed" layer on the barrier layer 20 subsequently followed by conventional plating techniques, e.g., electroless or electroplating techniques, to fill the via 51 and trench 50. So as to ensure complete filling of the via 51 and trench 50, the Cu-containing conductive layer 22 is deposited as a blanket (or "overburden") layer 24 so as to overfill the trench 50 and via 51 and cover the upper surface of the capping layer 13.

Figure 1J:
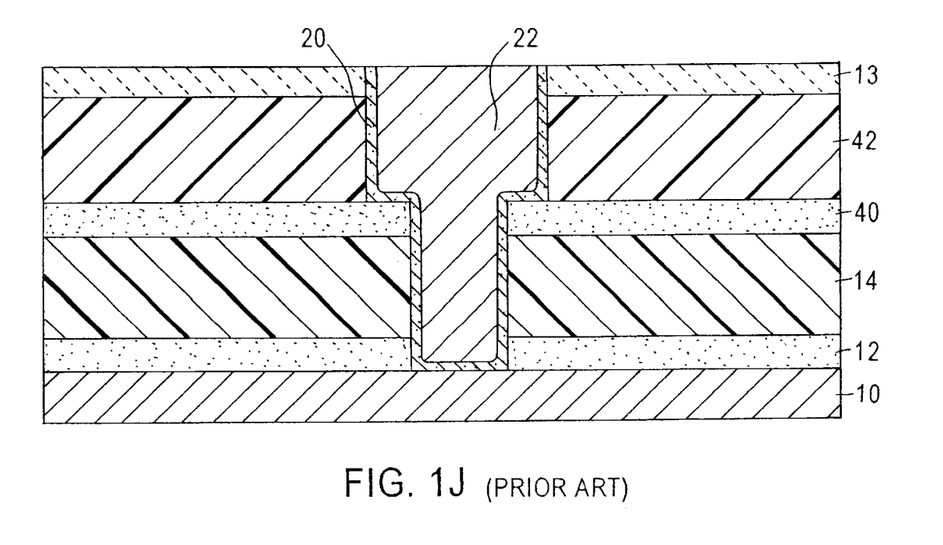

In FIG. 1J, the entire excess thickness of the metal overburden layer 24 over the upper surface of the capping layer 13 is removed using a CMP process. A typical CMP process utilizes an alumina ($Al_2O_3$)-based slurry, which leaves a conductive plug in the via 51 and a second metallization level in the trench 50. The second metallization level has an exposed upper surface which is substantially co-planar with the upper surface of the capping layer 13.

One problem associated with above-identified processes is the limited choices of material for the middle etch stop layer, etch stop layer 40 in the above example. A commonly used material as an etch stop is silicon nitride, which has a dielectric constant of about 7.0. However, the use of a thick etch stop layer of silicon nitride with a low-k dielectric layer partially negates the benefits obtained by use of a low-k dielectric material because of the increased combined capacitance of the etch stop layer and dielectric layer. Accordingly, a need exists for an improved method of forming copper plugs and copper metallization with low-k dielectric layers yielding an improved combined dielectric constant and corresponding decreased combined capacitance.

SUMMARY OF THE INVENTION

This and other needs are met by embodiments of the present invention which provide, in one aspect, a method of manufacturing a low-k semiconductor structure including the steps of forming a low-k dielectric layer, forming a sacrificial etch stop layer adjacent the low-k dielectric layer, and applying energy to the sacrificial etch stop layer to diffuse a component of the sacrificial etch stop layer into the adjacent low-k dielectric layer. This diffusion of the component lowers the dielectric constant of the adjacent low-k dielectric layer.

In another aspect, the invention includes a method of manufacturing a low-k semiconductor device including the steps of forming a metallization layer, forming an etch stop layer on the metallization layer, forming a first low-k dielectric layer on the etch stop layer, forming a sacrificial carbon-bearing middle stop layer on the first low-k dielectric layer, and forming a second low-k dielectric layer on the sacrificial carbon-bearing middle stop layer. Energy is applied to the sacrificial carbon-bearing middle stop layer to diffuse carbon from the sacrificial carbon-bearing middle stop layer to at least one of the first and second low-k dielectric layers, wherein the diffusion of carbon into the first or second low-k dielectric layer lowers the dielectric constant of the corresponding low-k dielectric layer.

In other aspects, the invention includes a low-k semiconductor device including a low-k dielectric layer comprising a low-k material and a middle stop layer comprising a diffusible component disposed adjacent the low-k dielectric layer, wherein the low-k material comprises bonds formed with the diffusible component. In one aspect of this device, the middle stop layer comprises amorphous carbon, the diffusible component comprises carbon, and low-k material bonds formed with the diffusible component are Si—C bonds.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and provides a solution to some of the problems of high capacitance-inter-metal dielectric layers. This result is achieved, in a preferred embodiment, by providing a carbon-bearing etch stop layer between first and second dielectric layers, wherein both the carbonbearing etch stop material and the dielectric materials are low-k dielectric materials. Advantageously, the second etch stop layer is treated, such as by thermal or electromagnetic methods, to promote diffusion of carbon to at least one of the dielectric layers to replace Si—OH bonds, which increase the dielectric constant, with Si—C bonds, which decrease the dielectric constant.

An embodiment of the present invention is illustrated in FIGS. 2A–2J. The dual damascene process to be described is illustrative of one sequence of steps, which can be used to practice the invention. In particular, the process provides a dual damascene structure, which includes a first metallization level, over which first and second dielectric layers are disposed, and the first and second dielectric layers respectively include a via and trench filled with a conductive material. However, the invention is not limited to the particular sequence of steps described to provide the dual damascene structure, as other sequence of steps capable of providing the dual damascene structure can be used to practice the invention.

Figure 2A:
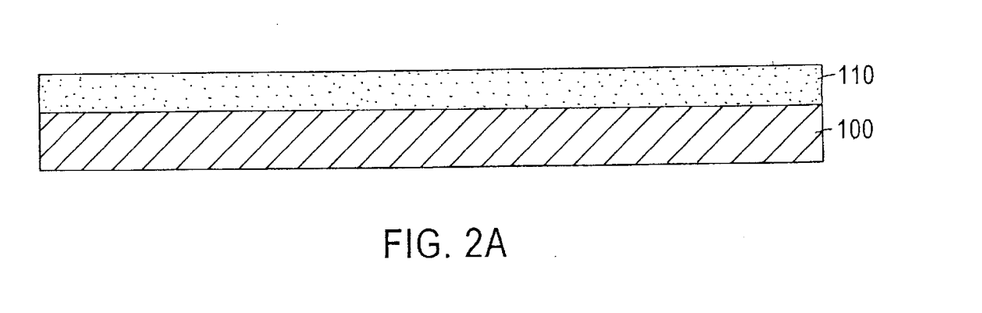
FIGS. 2A–2K schematically illustrate sequential phases of a dual damascene process in accord with the invention.

As illustrated in FIG. 2A, first etch stop layer 110 is deposited over a first metallization layer 100. The first etch stop layer 110 acts as an etch stop during etching of a subsequently formed dielectric layer. In an aspect of the invention, the thickness of the first etch stop layer 110 is approximately 500 Angstroms and is preferably between about 200 to 1500 Angstroms. In current embodiments of the invention, the first etch stop layer 110 is formed from silicon nitride, although the invention is not limited in this manner and may include any conventional etch stop material able to act as an etch stop for etchants used to etch low-k dielectric materials. Any process capable of depositing the first etch stop layer 110 is acceptable for use with the invention, and an illustrative process for depositing silicon nitride is PECVD.

Figure 2B:
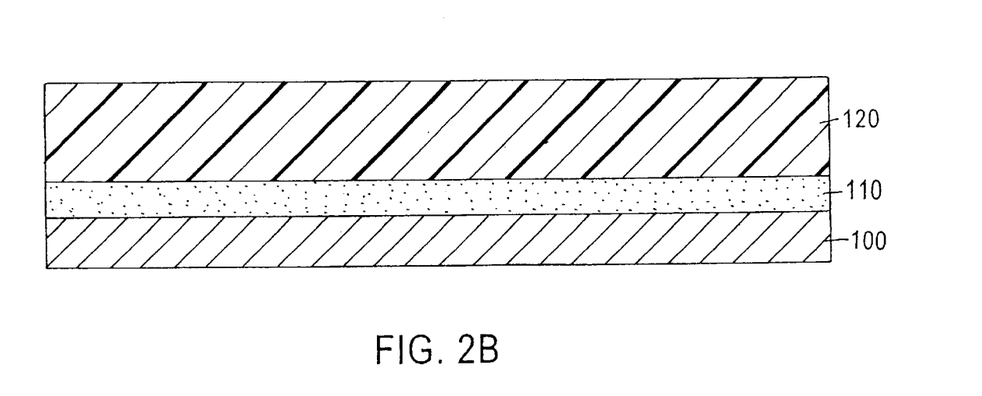

In FIG. 2B, a first dielectric layer 120 is deposited over the first etch stop layer 110. The first dielectric layer 120 can be formed from any material capable of acting as a dielectric, such as silicon oxide; fluorosilicate glass (FSG or SiOF); hydrogen silsesquioxane (HSQ); hydrogenated diamond-like carbon (DLC); polystyrene; nanoporous silica; fluorinated polyimides; parylene (AF-4); poly(arylene) ether; polytetrafluoro-ethylene (PTFE); divinyl siloxane bis-benzocyclobutene (DVS-BCB); aromatic hydrocarbons, hybrid-silsesquioxanes; and siloxanes, silsesquioxanes, aerogels, and xerogels having varying degrees of porosity. Other dielectric materials, preferably low-k dielectric materials, may also be used in accord with the invention. These dielectric materials can be applied via conventional spin-coating, dip coating, spraying, or meniscus coating methods, in addition to other coating methods that are well-known in the art. The first dielectric layer 120 is preferably formed to a thickness or depth of between about 1500 to 10,000 Angstroms and is preferably about 3500 Angstroms.

In a preferred aspect of the invention, the first dielectric layer 120 is formed from an organosilicate glass (OSG), such as methyl silsequioxane (MSQ), which may be deposited by CVD or spin-coating, for example. MSQ contains both Si—O bonds and Si—C or Si—CH$_3$ bonds. During processing and application of the MSQ, some of the Si—C bonds are replaced by Si—OH, which detrimentally increases the dielectric constant. Following deposition, spin-coated materials are conventionally thermally cured at temperatures between about 400° C. to 500° C. However, curing may be postponed until later in the process, as desired. For example, depending on the exact sequence of steps employed during the dual damascene process, it may be advantageous to postpone curing until a point after a later deposited sacrificial etch stop, described below, has served its purpose as an etch stop. Postponing curing minimizes diffusion of a diffusible component in the sacrificial etch stop prior to use of the etch stop and thereby minimizes potential degradation of the sacrificial etch stop.

Figure 2C:
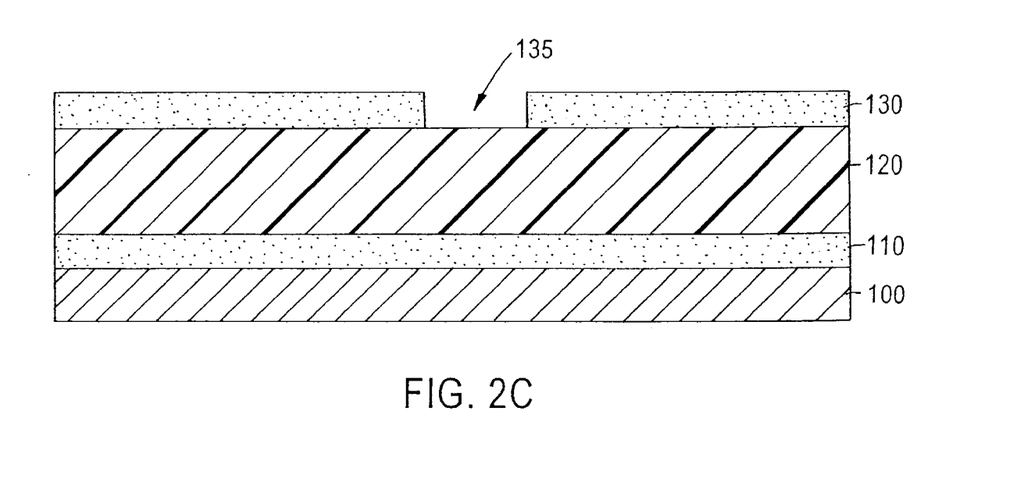

After formation of the first dielectric layer 120, a second etch stop layer or middle stop layer 130 is deposited over the first dielectric layer 120, as shown in FIG. 2C. The middle stop layer 130 acts as an etch stop during subsequent etching of the dielectric layer formed above the first etch stop layer 120. A via pattern 135 is etched, in a first etch, into the middle stop layer 130 using conventional photolithography and appropriate anisotropic dry etching techniques, such as an $CF_4$ or $CHF_3$ etch, often with an inert gas, such as argon (Ar), and an oxidizer, such as $O_2$, added, although many other etch gases, methods, and combinations are possible. (These steps are not depicted in FIG. 2C. Only the resulting via pattern 135 is depicted in FIG. 2C).

In an aspect of the invention, the middle stop layer 130 comprises a sacrificial amorphous carbon (a-C) layer or other carbon-bearing etch stop material. In other words, in this preferred aspect of the invention, the diffusible component of the sacrificial etch stop is carbon. Any middle stop layer 130 material may be used so long as the material can act as an etch stop and permits diffusion of a diffusible component, such as carbon, from the sacrificial middle stop layer material into an adjacent dielectric material disposed at one or more sides of the middle stop layer 130 at a reasonable temperature, below about 450° C., during subsequent treatment whereupon the diffusible component replaces bonds that increase the dielectric constant of the material and forms new bonds with the dielectric material that decrease the dielectric constant of the material. In a preferred aspect, the treatment of the middle stop layer, described in more detail below, includes heating the middle stop layer to about 400° C. for about an hour. As a result of the diffusion of carbon from middle stop layer 130 into an adjacent dielectric layer 120 (e.g., MSQ) during this treatment, the dielectric constant of the dielectric material is reduced due to the replacement of some of the dielectric layer (e.g., 120) Si—OH bonds with Si—C bonds.

Further, the middle stop layer 130 should have a dielectric constant that is lower than the dielectric constant of about 4.0, although the invention in not limited in this manner. For example, the dielectric constant of amorphous carbon is below 4.0, whereas silicon nitride possesses a dielectric constant of approximately 7.0. Thus, the middle stop layer 130 lowers the combined capacitance of the inter-metal dielectric layers by virtue of its own dielectric constant, in comparison to arrangements that employ silicon nitride.

The thickness of middle stop layer 130 is selected to provide for etch stopping of an etchant during subsequent etching steps. In one aspect of the invention, the thickness of middle stop layer 130 is between about 250 to 1000 Angstroms. In another aspect of the invention, the thickness of the middle stop layer 130 is between about 350 to 750 Angstroms. In a preferred embodiment, the thickness of middle stop layer 130 is approximately 500 Angstroms. Any process capable of depositing middle stop layer 130 is acceptable for use with the invention, and an illustrative process for depositing the amorphous carbon is CVD.

Figure 2D:
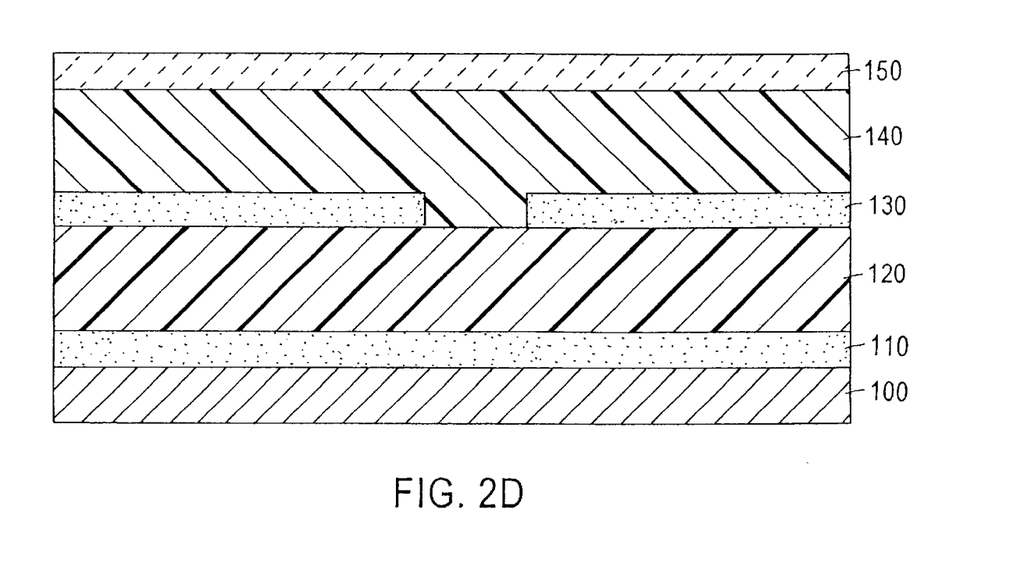

In FIG. 2D, a second dielectric layer 140 is deposited over middle stop layer 130. The second dielectric layer 140 can be formed from any material capable of acting as a dielectric, and illustrative materials include silicon oxide; fluorosilicate glass (FSG or SiOF); hydrogen silsesquioxane (HSQ); hydrogenated diamond-like carbon (DLC); polystyrene; nanoporous silica; fluorinated polyimides; parylene (AF-4); poly(arylene) ether; polytetrafluoro-ethylene (PTFE); divinyl siloxane bisbenzocyclobutene (DVS-BCB); aromatic hydrocarbons, hybrid-silsesquioxanes; and siloxanes, silsesquioxanes, aerogels, and xerogels having varying degrees of porosity. Other dielectric materials, preferably low-k dielectric materials, may also be used in accord with the invention. These dielectric materials can be applied via conventional spin-coating, dip coating, spraying, or meniscus coating methods, in addition to other coating methods that are well-known in the art. As with the first dielectric layer 120, it is preferred that the second dielectric layer 140 be formed to a thickness or depth of between about 1500 to 10,000 Angstroms and, more preferably, a thickness of about 3500 Angstroms.

After formation of the second dielectric layer 140 and planarization, if necessary, a capping layer 150 can be formed to a thickness of between about 250 to 3000 Angstroms over the second dielectric layer 140 such as by chemical vapor deposition (CVD) methods or physical vapor deposition (PVD) methods. It is preferred that the thickness of capping layer 150 is about 1300 Angstroms. One function of the capping layer 150 is to protect the second dielectric layer 140 from the process that removes a subsequently formed resist layer. The capping layer 150 can also be used as a mechanical polishing stop to prevent damage to the second dielectric layer 140 during subsequent polishing away of conductive material deposited over the second dielectric layer 140 and in a subsequently formed via and trench. Examples of materials used as a capping layer 150 include silicon oxide and silicon nitride. In an aspect of the invention, the capping layer 150 is formed from silicon oxide, which has a dielectric constant lower than that of silicon nitride, and has a thickness of at least 50 Angstroms. In another aspect of the invention, the thickness of the capping layer is from about 400 to about 600 Angstroms.

Figure 2E:
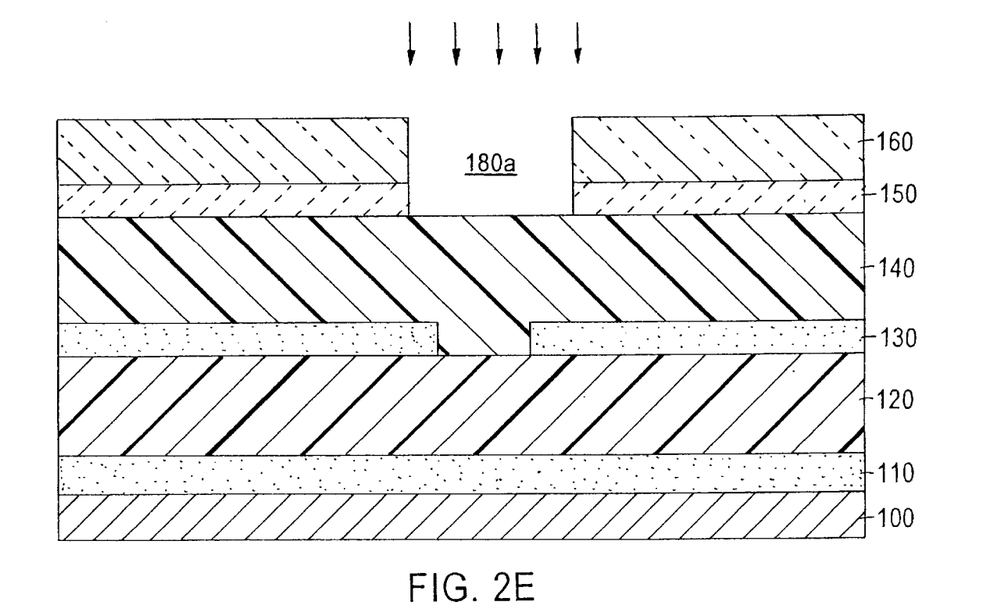

As shown in FIG. 2E, a resist 160 is deposited over capping layer 150 and second dielectric layer 140 for use in subsequent lithographic processing, wherein resist 160 is exposed and developed in accord with conventional lithographic techniques to form the desired pattern of the trench and/or vias. The thickness of the resist is between about 1000 and 10,000 Angstroms and is preferably about 5400 Angstroms. These conventional lithographic techniques include, for example, optical lithography (including, for example, I-line and deep-UV), X-ray, and E-beam lithography, followed by an etching of portions of capping layer 150, such as by an anisotropic dry etch, as depicted in FIG. 2E.

Figure 2F:
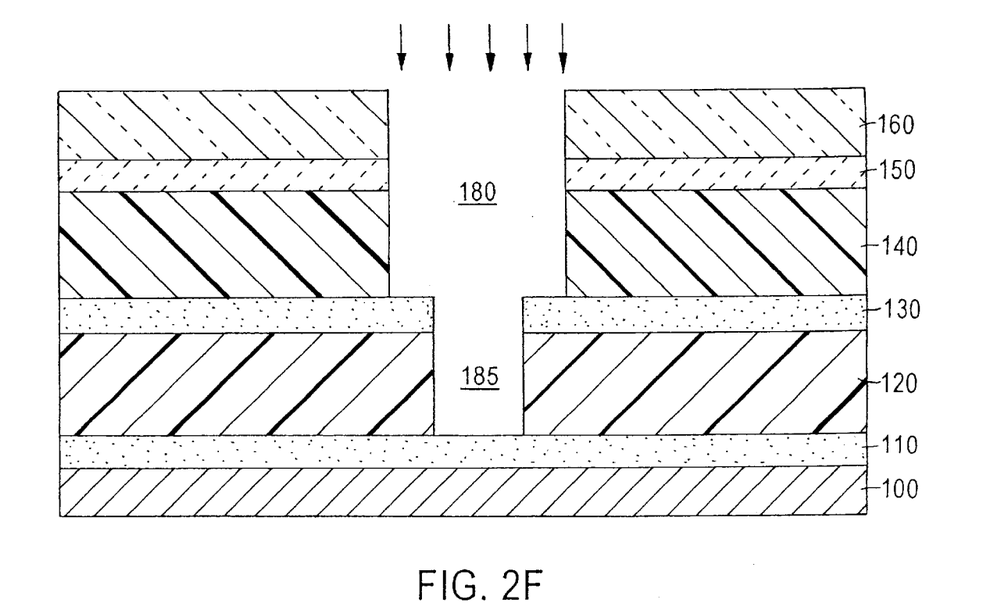

Another etch, depicted in FIG. 2F, is then performed using an etchant that preferentially etches the material of the first and second dielectric layers 120, 140, but not the capping layer 150, resist 160, or middle stop layer 130, to remove exposed portions of the dielectric layers until the etchant reaches etch stop layer 110. This etch is typically an anisotropic etch, such as a reactive ion plasma dry etch, that removes the exposed portions of the second dielectric layer 140 directly below the opening in the resist 160 to form trench 180. This etch also anisotropically etches portions of the first dielectric layer 120 exposed through via pattern 135 in middle stop layer 130 until the etch stop layer 110 is reached, thereby forming via 185. A preferred etchant for the dielectric layers 120, 140 is a plasma mixture of $C_4F_8$+CO+Ar+$N_2$, although many other gases, etching methods, and combinations of etchant/passivant are possible. This anisotropic etch forms a via 185 and trench 180 with substantially perpendicular sidewalls.

Figure 2G:
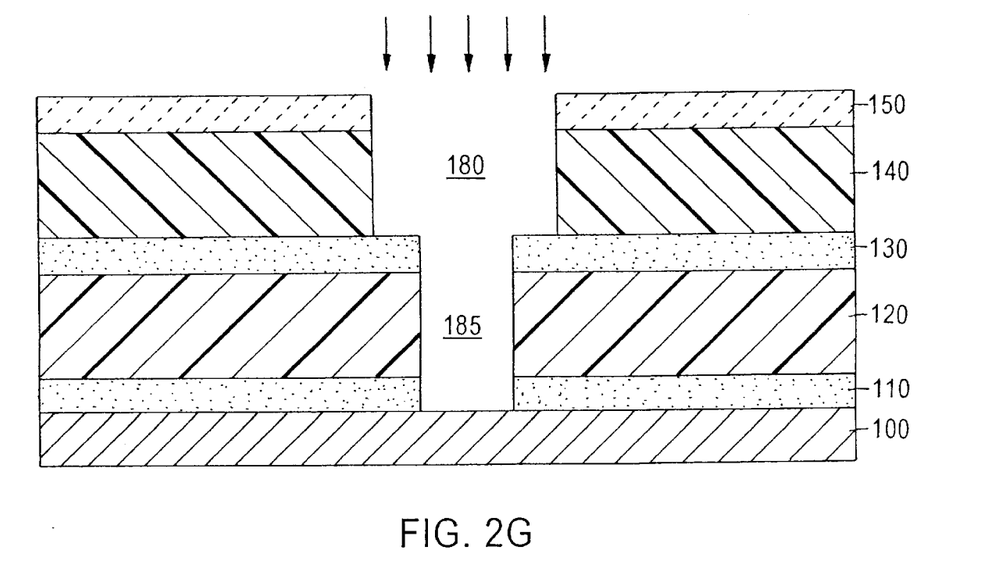

In FIG. 2G, an etch which preferentially removes the material of the first etch stop layer 110, typically an anisotropic etch, is performed to remove the first etch stop layer 110 and expose the underlying metallization layer 100. For the above described SiN etch stop layer 110, a preferred etchant is a $CHF_3$+Ar+$N_2$ plasma, although many other gases, etching methods, and combinations of gases may be used in accord with the process parameters and the particular etch stop layer material selected. Resist 160 may be removed prior to or subsequent to the fourth etch, such as by an oxygen plasma etch or by other conventional methods.

Figure 2H:
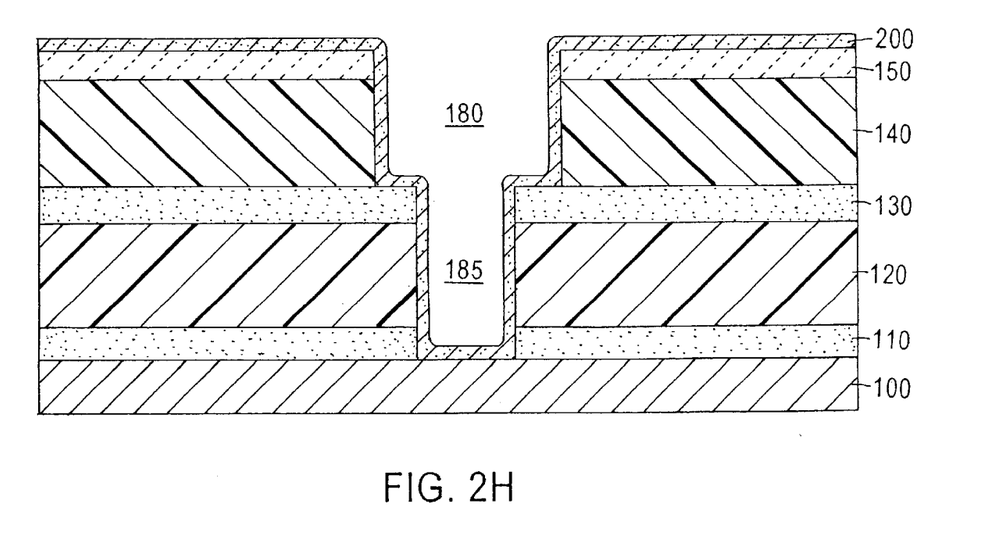

In FIG. 2H, an adhesion/barrier material, such as tantalum, titanium, tungsten, tantalum nitride, or titanium nitride, is deposited in via 185 and trench 180 and over the capping layer 150. The combination of the adhesion and barrier material is collectively referred to as a diffusion barrier layer 200. The diffusion barrier layer 200 acts to prevent diffusion of conductive material deposited in via 185 and trench 180 into the first and second dielectric layers 120, 140.

Figure 2I:
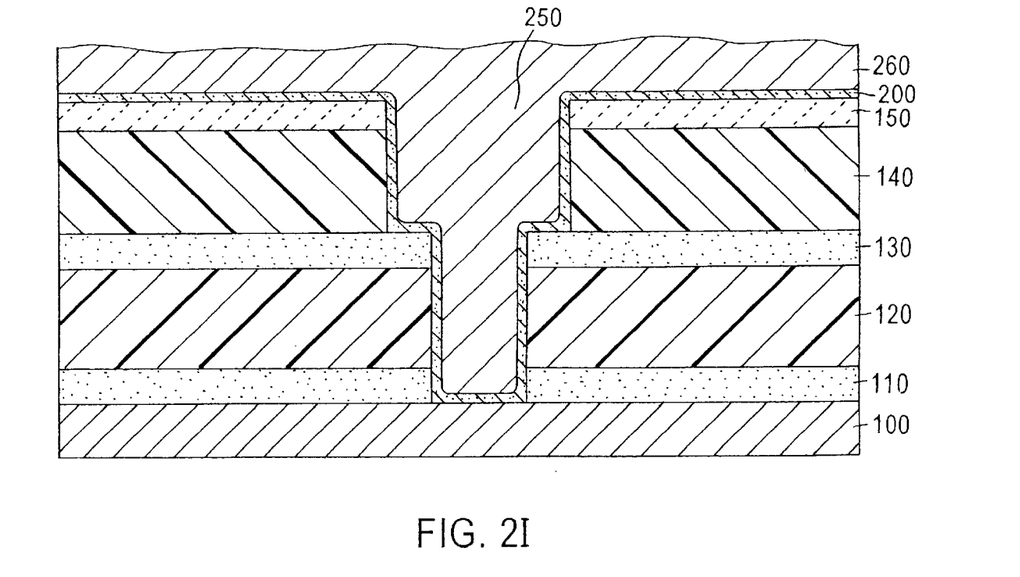

In FIG. 2I, a layer 260 of a conductive material, for example, a Cu or Cu-based alloy, is deposited in via 185 and trench 180 and over the capping layer 150 to overlie the diffusion barrier layer 200. A typical process initially involves depositing a "seed" layer on the diffusion barrier layer 200, followed by conventional plating techniques such as electroless or electroplating techniques, to fill the via 185 and trench 180. To ensure complete filling of via 185 and trench 180, and thereby prevent void formation, the Cu or Cu-alloy 250 is deposited as a blanket (or "overburden") layer 260 so as to overfill the trench 180 and cover the upper surface of capping layer 150.

Figure 2J:
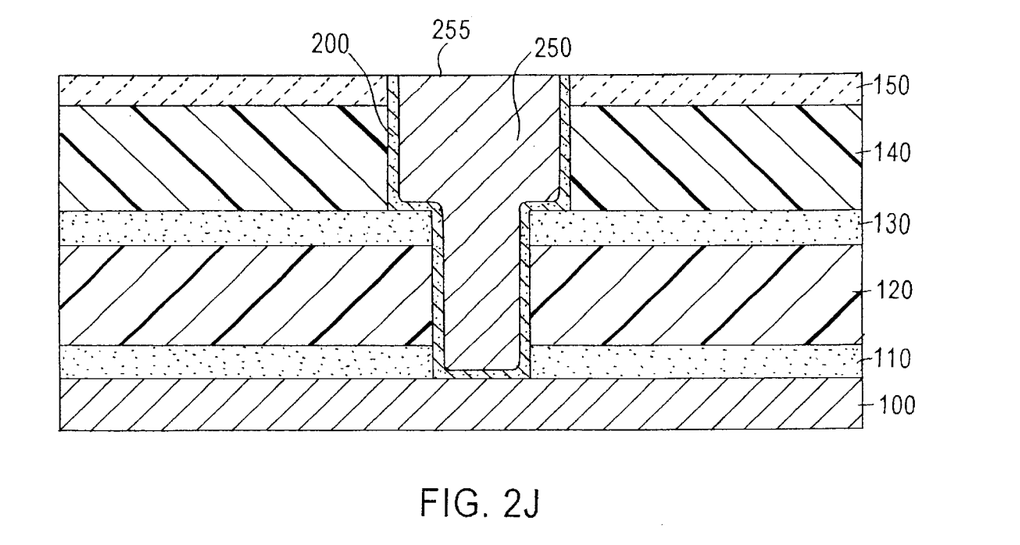

In FIG. 2J, the entire excess thickness of the metal overburden layer 260 over the upper surface of capping layer 150 is removed using a CMP process. A typical CMP process utilizes a slurry as an aid to polishing, such as an alumina ($Al_2O_3$)-based slurry, which leaves a conductive plug in the via 185 and a second metallization level in the trench 180. The second metallization level has an exposed upper surface 255, which is substantially co-planar with an upper surface of capping layer 150.

Figure 2K:
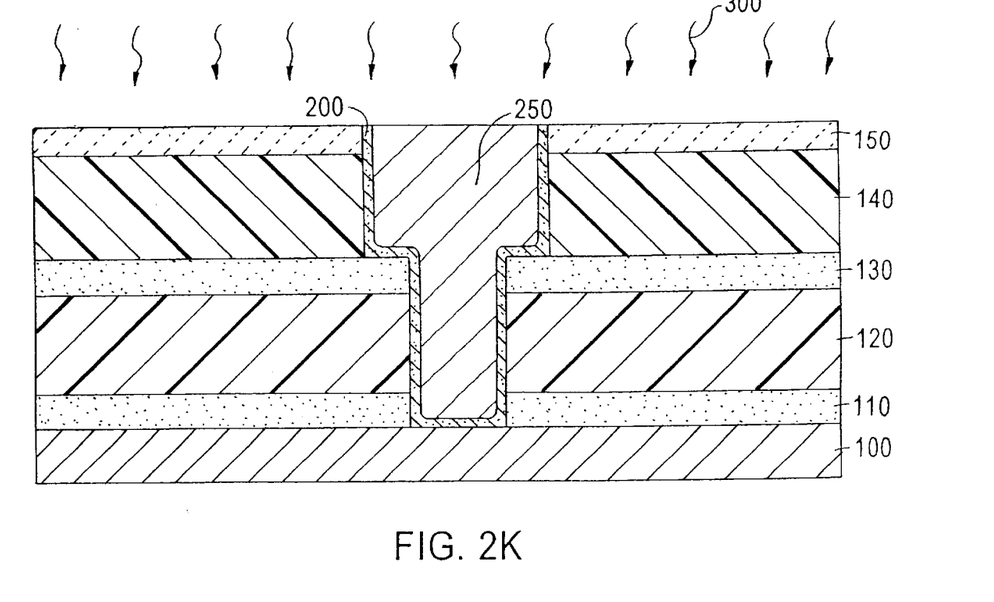
Figure 3:
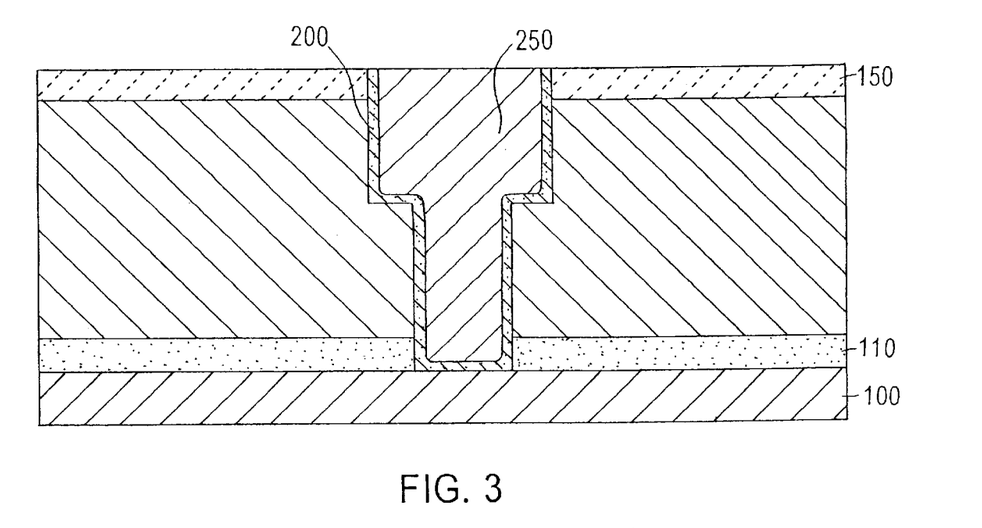
FIG. 3 illustrates the structure of a dual damascene semiconductor device in accord with the invention.

In FIG. 2K, the structure depicted in FIG. 2K is subjected to treatment, wherein energy 300 is applied to cause diffusion of carbon from the middle stop layer 130 into the adjacent dielectric layers 120, 140 and promote replacement of at least some of the dielectric layer 120, 140 Si—OH bonds with Si—C bonds. The energy 300 may be provided to the middle stop layer 130 by conventional methods of energy application including, for example, a furnace or oven, hot plate, IR heating, ultraviolet (UV), deep ultraviolet (DUV) or vacuum ultraviolet (VUV), and e-beam.

In a preferred aspect, the structure is treated with a hot plate. The structure is heated to a temperature between about 150° C. to 450° C., and preferably between about 375° C. to 425° C., which provides fast diffusion of the diffusible component (e.g., carbon) from the middle stop layer 130 (e.g., amorphous carbon) without collateral damage to first and second low-k dielectric layers 120, 140 which may occur at temperatures above about 450° C. This heating is maintained for between about 30 minutes to about three hours, in accord with the selected temperature or plurality of temperatures, if a range of temperatures are employed during treatment.

The treatment of the amorphous carbon middle stop layer 130 in accord with the present invention reduces the dielectric constant of first and second low-k dielectric layers 120, 140 comprising MSQ from about 3.0 to about 2.7. In addition, as noted above, compared with the prior art technique of using a SiN middle stop layer, wherein the SiN has a dielectric constant of about 7.0, the present invention reduces the overall dielectric constant of the stack by eliminating the high-k SiN middle stop layer.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a low-k semiconductor structure, comprising the steps of:
    forming a low-k dielectric layer;
    forming a sacrificial etch stop layer adjacent the low-k dielectric layer; and
    applying energy to the sacrificial etch stop layer to diffuse a component of the sacrificial etch stop layer into the adjacent low-k dielectric layer,
    wherein the diffusion of said component lowers the dielectric constant of the adjacent low-k dielectric layer.

2. The method of manufacturing a low-k semiconductor structure according to claim 1, wherein the sacrificial etch stop layer is a carbon-bearing material.

3. The method of manufacturing a low-k semiconductor structure according to claim 2, wherein the sacrificial etch stop layer is an amorphous carbon.

4. The method of manufacturing a low-k semiconductor structure according to claim 1, wherein, prior to the applying energy step, the low-k dielectric layer comprises a plurality of first bonds biasing a bulk dielectric coefficient toward a first dielectric coefficient, and wherein the component diffused from the sacrificial etch stop layer in the applying energy step replaces a component in at least some of said plurality of first bonds to change the first bonds into second bonds which bias the bulk dielectric toward a second dielectric coefficient less than the first dielectric coefficient.

5. The method of manufacturing a low-k semiconductor structure according to claim 4, wherein the first bonds are Si—OH bonds and the second bonds are Si—C bonds.

6. The method of manufacturing a low-k semiconductor structure according to claim 5, wherein the step of applying energy comprises:
    heating the low-k semiconductor structure to a temperature between about 150° C. and 450° C.;
    maintaining said temperature for a duration of between about 30 minutes to 3 hours.

7. The method of manufacturing a low-k semiconductor structure according to claim 5, wherein the step of applying energy comprises:
    heating the low-k semiconductor structure to a temperature between about 375° C. and 425° C.;
    maintaining said temperature for a duration of between about 45 minutes to two hours.

8. The method of manufacturing a low-k semiconductor structure according to claim 7, wherein the step of forming the low-k dielectric layer comprises CVD of an organosilicate glass.

9. The method of manufacturing a low-k semiconductor device, comprising the steps of:
    forming a metallization layer;
    forming an etch stop layer on the metallization layer;
    forming a first low-k dielectric layer on the etch stop layer;
    forming a sacrificial carbon-bearing middle stop layer on the first low-k dielectric layer;
    forming a second low-k dielectric layer on the sacrificial carbon-bearing middle stop layer; and
    applying energy to the sacrificial carbon-bearing middle stop layer stack to diffuse carbon from the sacrificial carbon-bearing middle stop layer at least one of the first and second low-k dielectric layers,
    wherein the diffusion of carbon into the first or second low-k dielectric layer lowers the dielectric constant of the corresponding low-k dielectric layer.

10. The method of manufacturing a low-k semiconductor device according to claim 9, wherein the sacrificial carbon-bearing middle stop layer is amorphous carbon.

11. The method of manufacturing a low-k semiconductor device according to claim 10, wherein, prior to the applying energy step, the low-k dielectric layer comprises a plurality of first bonds biasing a bulk dielectric coefficient toward a first dielectric coefficient, and wherein the carbon diffused from the sacrificial carbon-bearing etch stop layer in the applying energy step replaces a component in at least some of said plurality of first bonds to change the first bonds into second bonds which bias the bulk dielectric toward a second dielectric coefficient less than the first dielectric coefficient.

12. The method of manufacturing a low-k semiconductor device according to claim 11, wherein the first bonds are Si—OH bonds and the second bonds are Si—C bonds.

13. The method of manufacturing a low-k semiconductor device according to claim 12, wherein the step of applying energy comprises:
    heating the low-k semiconductor device to a temperature between about 150° C. and 450° C.;
    maintaining said temperature for a duration of between about 30 minutes to 3 hours.

14. The method of manufacturing a low-k semiconductor device according to claim 12, wherein the step of applying energy comprises:
    heating the low-k semiconductor device to a temperature between about 375° C. and 425° C.;
    maintaining said temperature for a duration of between about 45 minutes to two hours.

15. The method of manufacturing a low-k semiconductor device according to claim 14, wherein at least one of said steps of forming a first low-k dielectric layer on the etch stop layer or forming a second low-k dielectric layer on the sacrificial carbon-bearing middle stop layer comprises CVD of an organosilicate glass.

16. The method of manufacturing a low-k semiconductor device according to claim 15, wherein said organosilicate glass comprises methyl silsequioxane.

17. The method of manufacturing a low-k semiconductor device according to claim 16, further comprising the steps of;
    forming a capping layer on top of the second low-k dielectric layer;
    etching at least one of a trench and a via through the capping layer, second low-dielectric layer, sacrificial carbon-bearing middle stop layer, first low-k dielectric layer, and first etch stop layer;
    forming a diffusion barrier layer over sidewalls of the trench and via; and
    depositing a conductor comprising copper into the trench and via,
    wherein the above steps are performed prior to said step of providing energy.

18. The method of manufacturing a low-k semiconductor device according to claim 12, wherein the step of providing energy comprises imparting energy to the semiconductor device by at least one of a furnace, an oven, a hot plate, an IR source, an e-beam source, and a UV source.

* * * * *